(12) United States Patent
Boensch et al.

(10) Patent No.: US 7,632,109 B2
(45) Date of Patent: Dec. 15, 2009

(54) ELECTRICAL CONNECTING APPARATUS FOR FLAT CONDUCTORS

(75) Inventors: Matthis Boensch, Bielefeld (DE); Thorsten Beck, Bad Arolsen-Wetterburg (DE); Wolfgang Schild, Herford (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/287,298

(22) Filed: Oct. 8, 2008

(65) Prior Publication Data
US 2009/0142954 A1     Jun. 4, 2009

Related U.S. Application Data

(63) Continuation of application No. PCT/EP2007/053306, filed on Apr. 4, 2007.

(30) Foreign Application Priority Data
Apr. 13, 2006   (DE) ................. 10 2006 017 969

(51) Int. Cl.
    *H01R 12/00*   (2006.01)
(52) U.S. Cl. ...................... 439/76.1; 439/521
(58) Field of Classification Search ............ 439/76.1, 439/76.2, 519–523; 361/641, 710
    See application file for complete search history.

(56) References Cited

U.S. PATENT DOCUMENTS

| 4,460,232 A | 7/1984 | Sotolongo |
| 7,097,516 B2 * | 8/2006 | Werner et al. ............... 439/709 |
| 7,369,398 B2 * | 5/2008 | Higashikozono et al. .... 361/641 |

FOREIGN PATENT DOCUMENTS

| DE | 203 11 183 U1 | 7/2004 |
| DE | 20 2005 018884 | 2/2006 |

\* cited by examiner

*Primary Examiner*—Khiem Nguyen
(74) *Attorney, Agent, or Firm*—Lawrence E. Laubscher, Sr.; Lawrence E. Laubscher, Jr.

(57) ABSTRACT

A connector assembly for connecting the flat conductors of a photovoltaic panel with an electrical component, such as a diode, printed circuit or the like, includes a conductor support body having a base portion adapted for connection with the photovoltaic panel, and a bridge portion carrying a plurality of flat seats with edges around which the free ends of the flat conductors are bent, respectively. A bus bar is provided for each flat conductor, each bus bar including a pair of resilient contacts arranged for engagement with the portion of the associated conductor that is bent around the conductor seat. A protective housing encloses the bus bars and at least the bridge portion of the support body, which housing contains openings for receiving output cables the ends of which are connected with the bus bars.

20 Claims, 20 Drawing Sheets

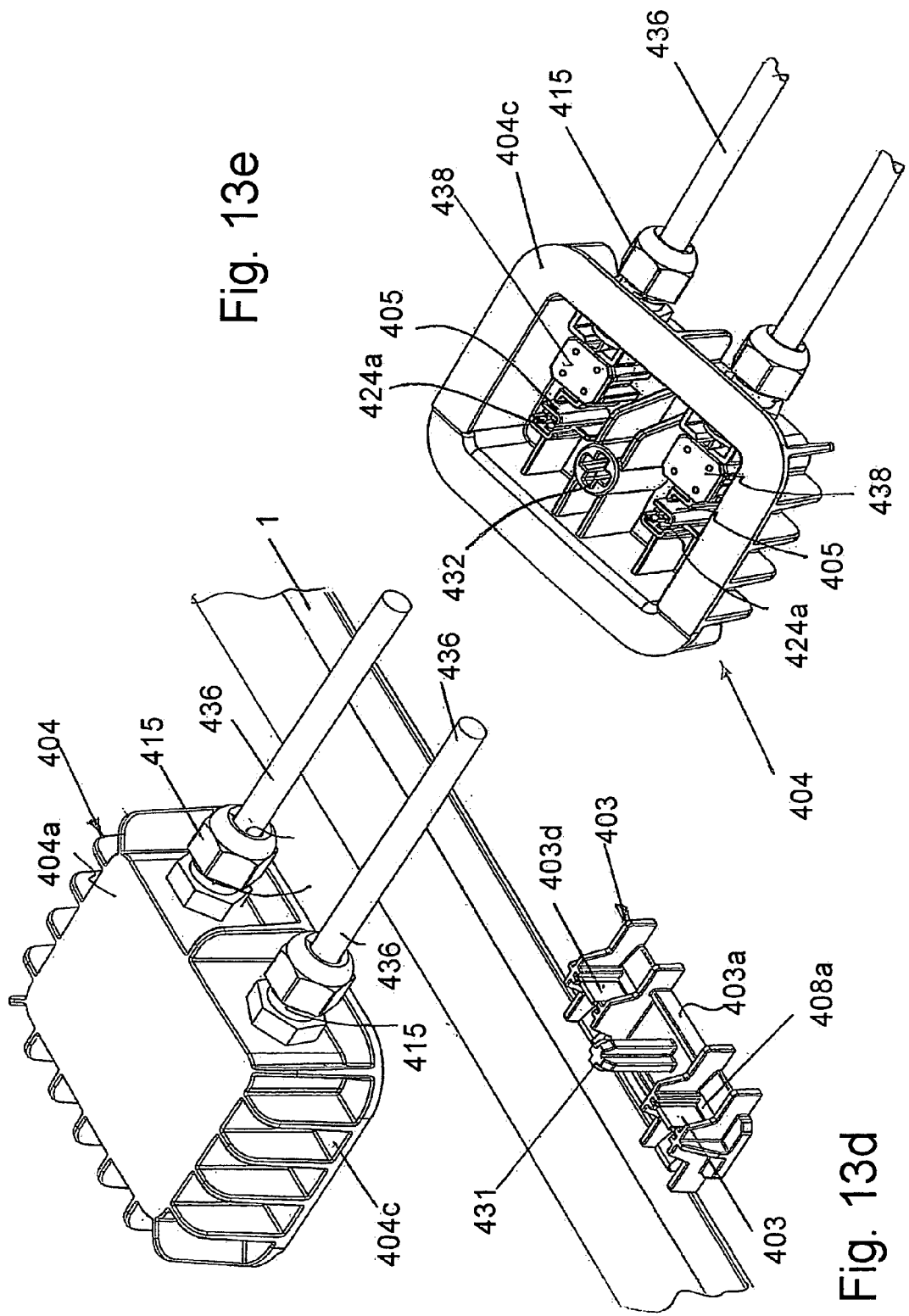

_US 7,632,109 B2_

ELECTRICAL CONNECTING APPARATUS FOR FLAT CONDUCTORS

REFERENCE TO RELATED APPLICATION

This is a companion application to the U.S. application Ser. No. 12/080,405 filed Apr. 2, 2008 in the names of Mattias Boensch et al entitled "Electrical Connector Arrangement for Knife Contacts".

This application is a national stage continuation of the PCT Application No. PCT/EP 2007/053306 filed Apr. 4, 2007, which in turn is based on the German Application No. 10 2006 017 969.2 filed Apr. 13, 2006.

BACKGROUND OF THE INVENTION

1. Field of the Invention

A connector assembly for connecting the flat conductors of a photovoltaic panel with an electrical component, such as a diode, printed circuit or the like, includes a conductor support body having a base portion adapted for connection with the photovoltaic panel, and a bridge portion carrying a plurality of flat seats with edges around which the free ends of the flat conductors are bent, respectively. A bus bar is provided for each flat conductor, each bus bar including a pair of resilient contacts arranged for engagement with the portion of the associated conductor that is bent around the conductor seat. A protective housing encloses the bus bars and at least the bridge portion of the support body, which housing contains openings for receiving output cables the ends of which are connected with the bus bars.

2. Description of Related Art

As a rule, photovoltaic systems have at least one photovoltaic panel for the purpose of generating current from sunlight. Normally, a plurality of flexible flat conductors extend out of the photovoltaic panels, thereby making it possible to connect the photovoltaic panels—as a rule, via a multi-conductor cable—for example, to a house installation or, even before that, to electrical appliances, such as a current inverter or the like.

According to the state of the art, the individual flat conductors are to be contacted manually by means of individual contacts or the like. This is why it is relatively laborious to connect the appliances and, as a rule, it is necessary to employ specially trained technicians to connect the appliances.

Moreover, there is the problem that installations constructed in this way as a rule are relatively confusing and are therefore only difficult to repair in case of trouble.

There are also typical connection devices with a receiving housing for the flat conductor ends by means of which the conductor ends can be contacted, as shown by the German patents Nos. DE 20 2005 018 884 U1) and DE 203 11 183 U1, and the U.S. Pat. No. 4,460,232.

Against this background, it is the object of the present invention to make a connection device for flat conductors by means wherein it will be possible to contact the flat conductors and to connect them to associated appliances or an electrical system in a manner that is simpler than the one now used in the art.

SUMMARY OF THE INVENTION

Accordingly, a primary object of the present invention is to provide a connector arrangement for connecting the flat conductor of a photovoltaic panel or the like to an electrical component, including a conductor support body that is adapted for fastening to the photovoltaic panel and that includes a plurality of support seats having edges about which the free ends of the flat conductors are bent, a plurality of bus bar means having clip-on tulip contacts arranged for electrical engagement with the bent back portions of the flat conductors on the support seats, respectively, and a protective housing mounted to enclose the bus bars and the conductor support body.

According to a more specific object of the invention, each of the bus bar means includes a pair of planar plated that are fastened together such that punched out contacts from the plates cooperating to define the clip-on connectors that function to connect the reversely-bent-back portions of the flat conductors to associated electrical components, such as diodes, printed circuit boards, output cable conductors, or the like.

A further object of the invention is to provide a protective housing containing a chamber for enclosing the bus bars and the conductor support member. In one embodiment, the housing has a bottom wall containing an opening that receives the conductor support body, and in another embodiment, the housing has an open bottom for seated engagement on the photovoltaic panel to enclose the conductor support body and the bus bars. In a further embodiment, the conductor support body is mounted within the chamber, and the flat conductors are introduced into the housing chamber via slits contained in the bottom wall of the housing.

In accordance with the present invention, the flat conductor ends that protrude from a photovoltaic panel are bent upon a conductor support body that can be fastened or adhesively secured upon the photovoltaic panel for the purpose of receiving the flat conductor ends and upon which the protective housing can be mounted.

In this way, the flat conductor ends are fixed in the manner of a first assembly step or a preassembly upon the receiving unit, which can then be contacted more easily as a preassembled unit than the known solutions according to the state of the art.

Preferably, the receiving unit is made as a receiving carrier that has at least one seat or a plurality of seats, in particular, seat bridges over which one of the particular flat conductor ends can be bent. Here it is practical when the receiving housing can be stuck or can be locked on the receiving carrier.

Preferably, the receiving unit has seats, especially seat bridges over which or upon which one of the flat conductor ends can then be flexibly fixed. This action of fixing on the receiving bridges can be accomplished in a particularly preferred and advantageous manner so that from the unit consisting of the flat conductor ends, one can, on the receiving bridges and on the receiving carrier, so to speak, fashion a kind of plug as part of the connection device directly upon the photovoltaic panel.

The receiving bridges can consist of a synthetic plastic or some other possibly conducting material provided one can make a possibly required insulating separation between the flat conductor ends. In this way in the area of each receiving bridge, there are therefore provided stable contacts from the flat conductor ends above the receiving bridges that can also readily be inserted against greater forces, for example, a resilient spring contact (in particular, also by way of the clip-on technique).

It is also advantageous to place the receiving housing over this preassembled unit as yet another part of the connection device, a sectional protective housing which has an open bottom side so that it can be set over the conductor support body. Preferably, this protective housing is also a part of the unit that is already preassembled before assembly so that on the top of only the photovoltaic panel with the box as a whole is pre-manufactured and preassembled, for example, upon a current converter.

This invention technically simplifies the connection of photovoltaic panels for use in structural installation systems. The connection can be done faster and even without tools according to a particularly preferred variant. The installation time, as well as the danger of improper installation, are also definitely reduced. Furthermore, easier maintenance and repair of the system are facilitated by the clearly arranged and self-explanatory installation.

The conductor support bridges can be arranged in a flush or mutually staggered offset manner with respect to each other. It is also conceivable to arrange them together parallel to each other, in particular, in a single row, because in that way, one can come up with a particularly narrow—albeit in return somewhat longer—connection device.

The present invention also creates a connection device for conductor ends, in particular, flat conductor ends upon a photovoltaic panel out of which protrude a plurality of flat conductor ends and which has a receiving housing that can be attached upon the photovoltaic panel, in particular, a connection device whereby the receiving housing has a receptacle that is closed up except for openings for cable passages for cables and except for the side that points toward the photovoltaic panel.

BRIEF DESCRIPTION OF THE DRAWINGS

Other objects and advantages of the invention will become apparent from a study of the following specification, when viewed in the light of the accompanying drawing, in which:

FIGS. 13a-13f are perspective views illustrating the assembly steps of a further embodiment of the invention.

DETAILED DESCRIPTION OF THE INVENTION

Figure 1A:
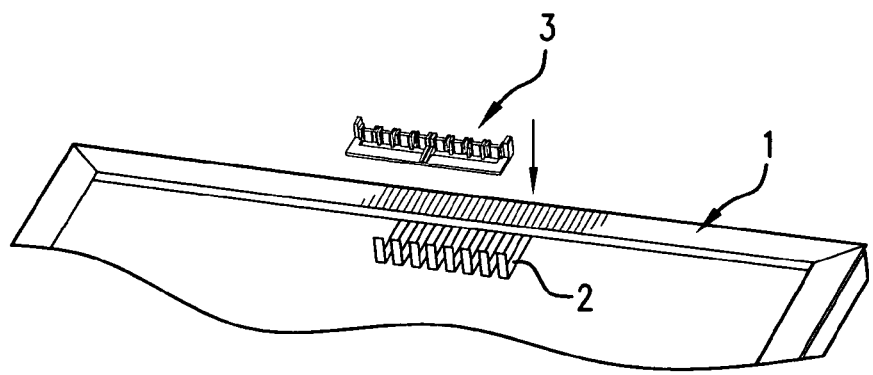
FIGS. 1a-1c illustrate the steps of folding, the free ends of the flat conductors of a photovoltaic panel reversely back over the edge of the conductor seats on the bridge portion of a conductor support member.
Figure 1B:
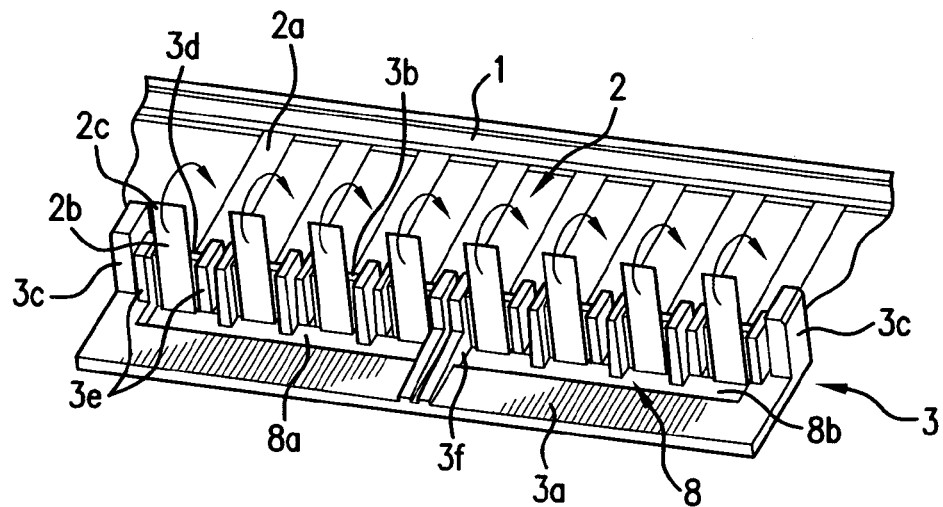
Figure 1C:
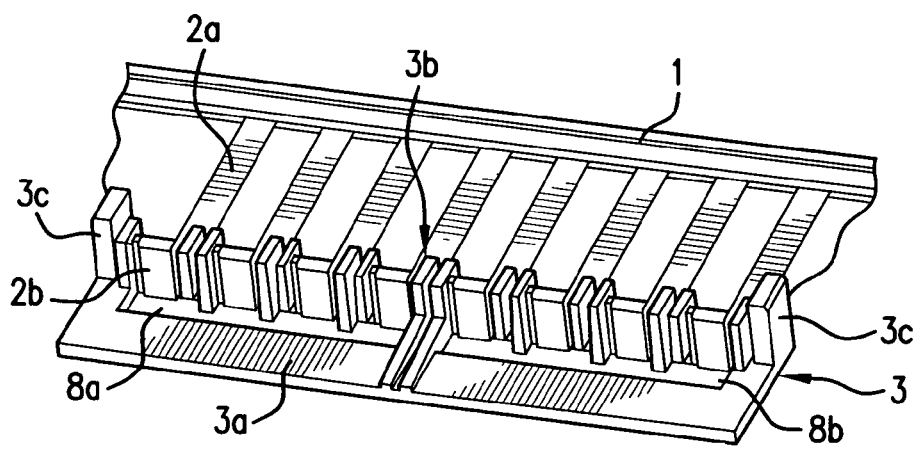
Figures 2A, 2B:
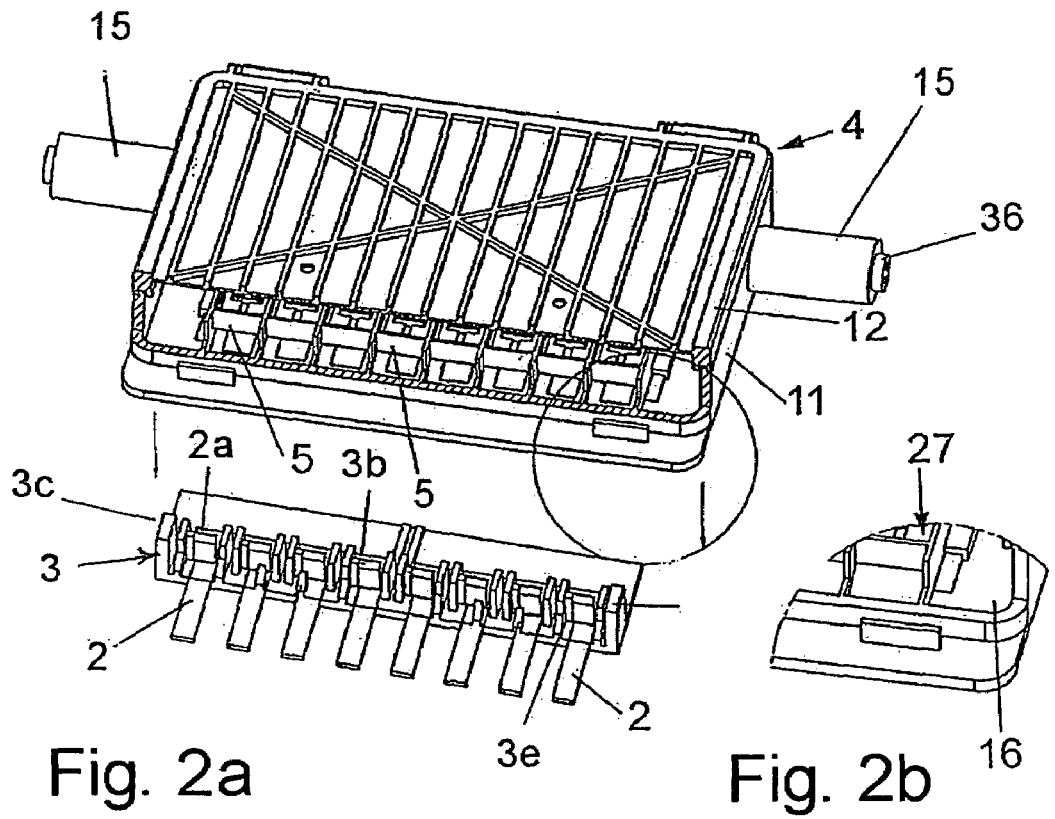
FIGS. 2a-2d illustrate the assembly steps for mounting the conductor support body in a protective housing.
Figures 2C, 2D:
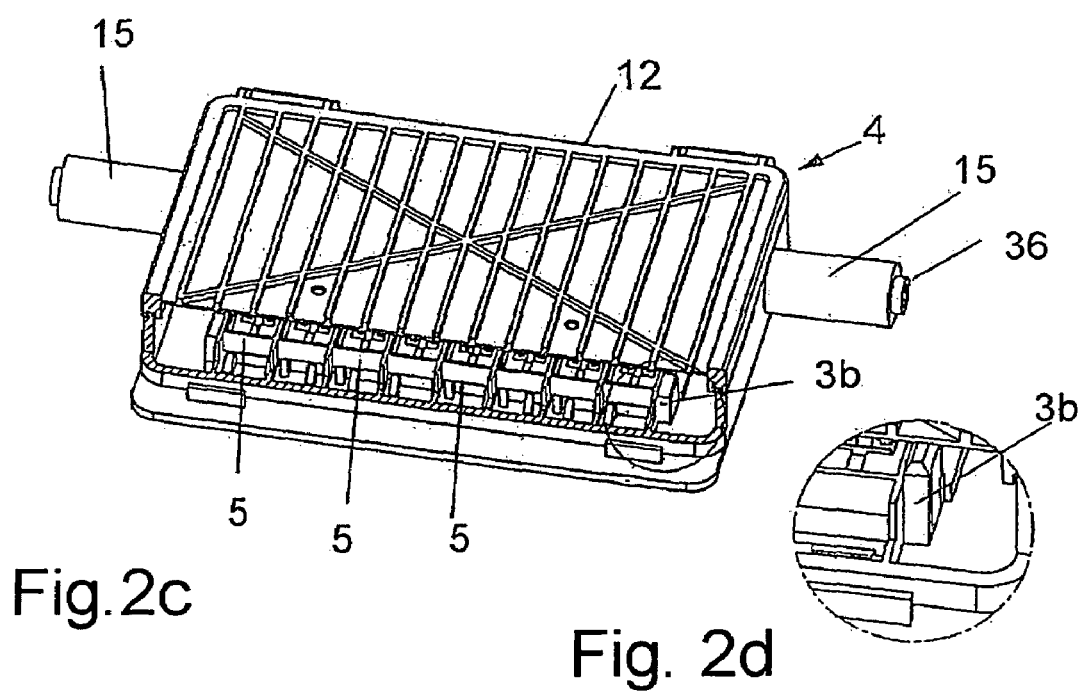
Figure 15:
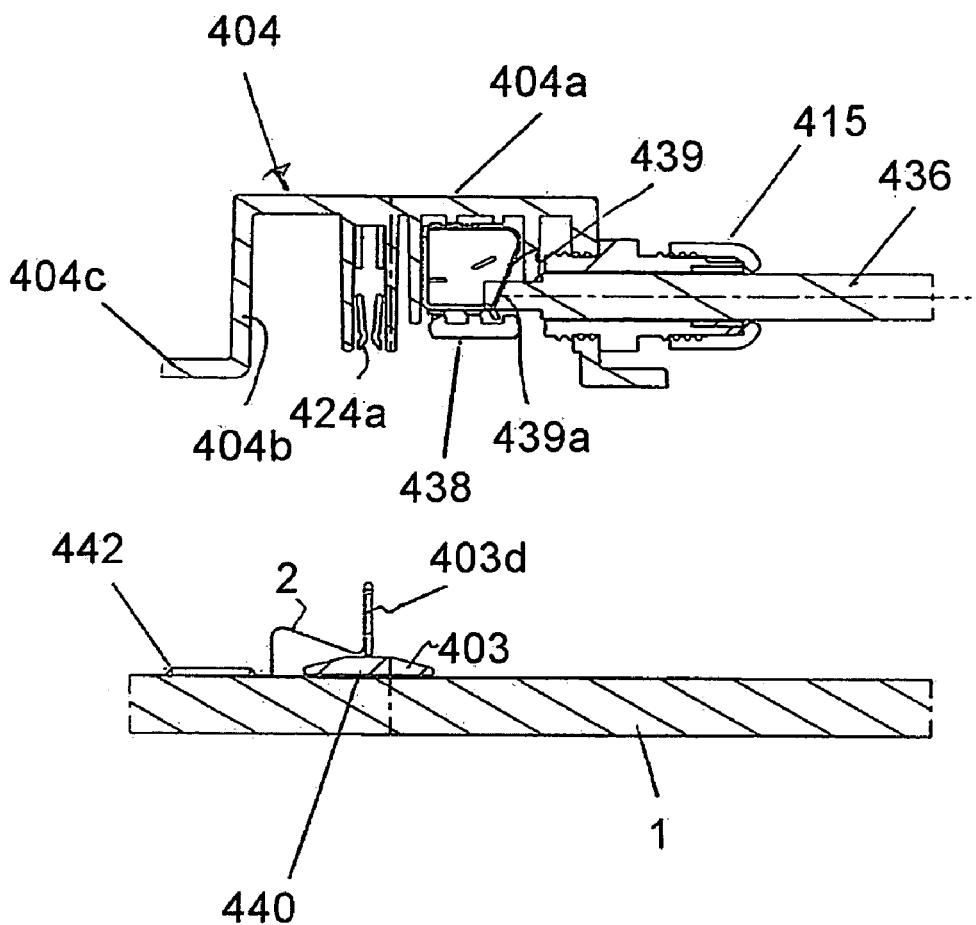
FIGS. 15 and 16 are sectional views of the apparatus of FIG. 14 in the separated and connected conditions, respectively.
Figure 16:
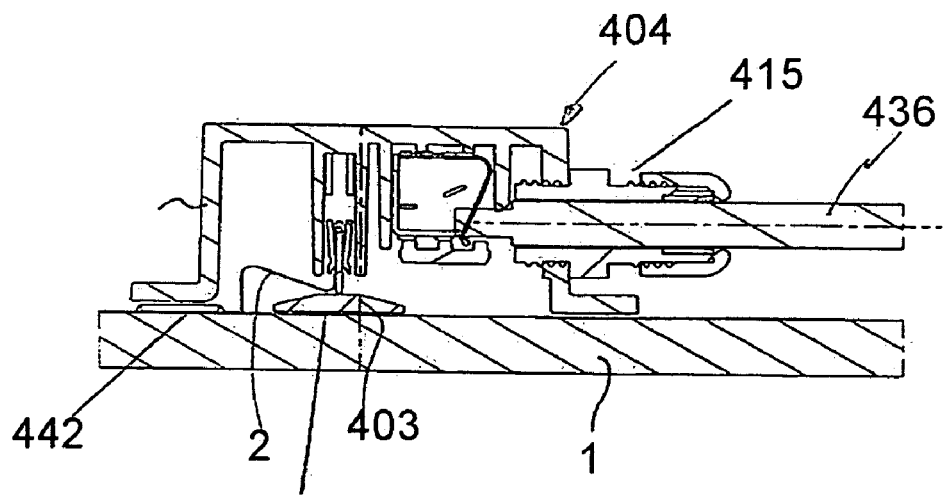
Figure 17:
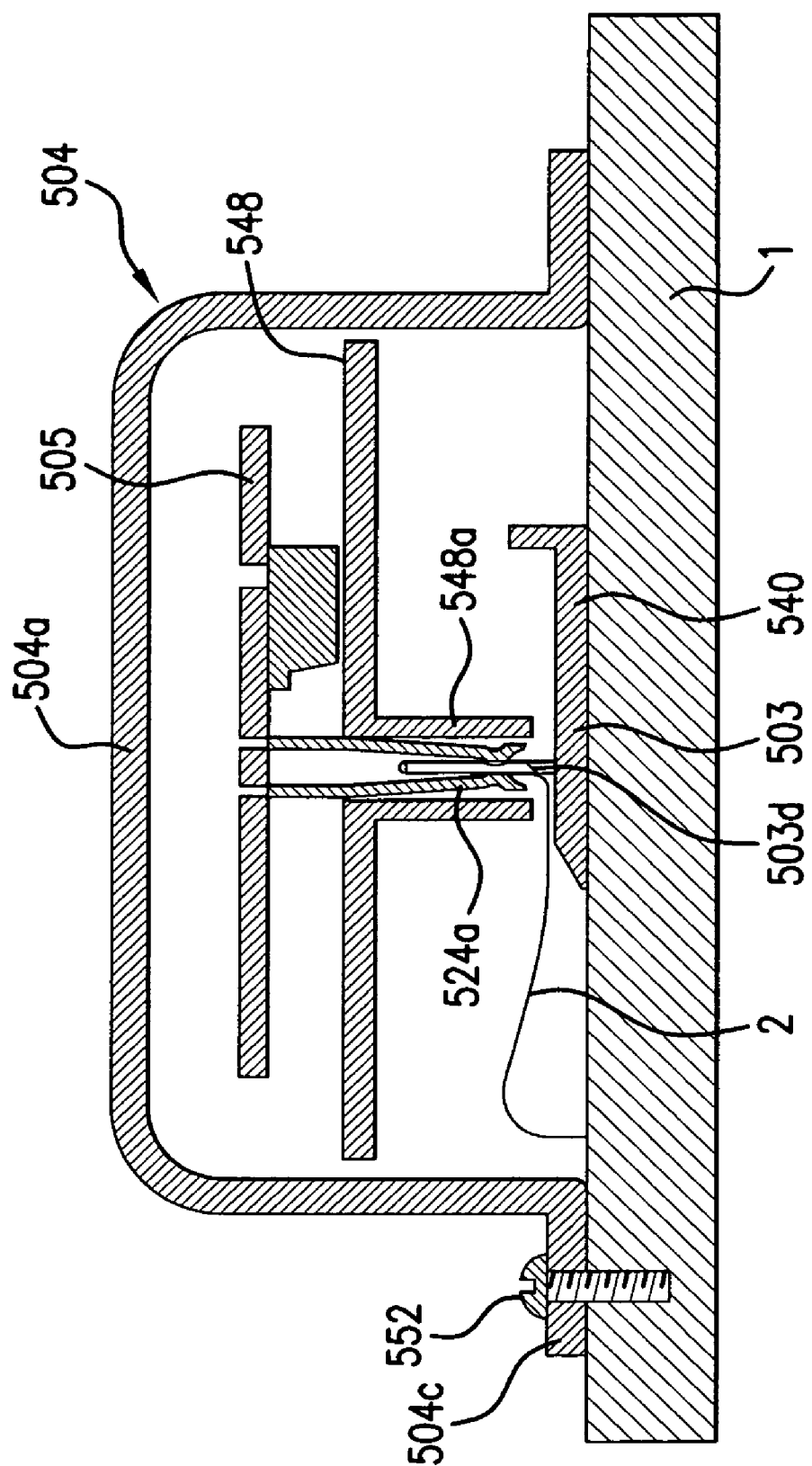
FIG. 17 is a sectional view of another modification of the invention.

Referring first more particularly to FIGS. 1a-1c, the photovoltaic panel 1 is provided with a plurality of parallel spaced flat conductors 2 that are connected by bending with the conductor support body 3 that is preferably formed from an electrical insulating synthetic plastic material. As shown in FIG. 1b, the flat conductors 2 have first portions 2a that are contained in a common first plane, and intermediate portions 2b that are orthogonally bent upwardly and extend through openings 8a and 8b contained in the generally planar base portion 3a of the conductor support body 3. The conductor body 3 includes a horizontal bridge portion 3b that is supported at its ends by vertical pedestal portions 3c that extend upwardly at the ends of the support body. The bridge portion 3b contains a plurality of longitudinally spaced conductor seats 3d that are defined between pairs of vertical spacer walls 3e. The center portion of the support body 3 is strengthened by support walls 3f that divide the opening 8 into the pair of smaller openings 8a and 8b. The conductor support seats 3d are planar and are arranged to support the intermediate portions 2b of the flat conductors. The free end portions 2c of the flat conductors extend upwardly beyond the upper edges of the support seats 3d, and are reversely bent back upon the outer side of the support seats as shown in FIGS. 1c and 3c. The base portion 3a of the support body 3 serves as a handling means for the component, and the lower surface of the base portion 3a is fastened to the photovoltaic panel 1, for example, by 2-sided adhesive strips, as best shown in FIGS. 15-17.

Figure 4A:
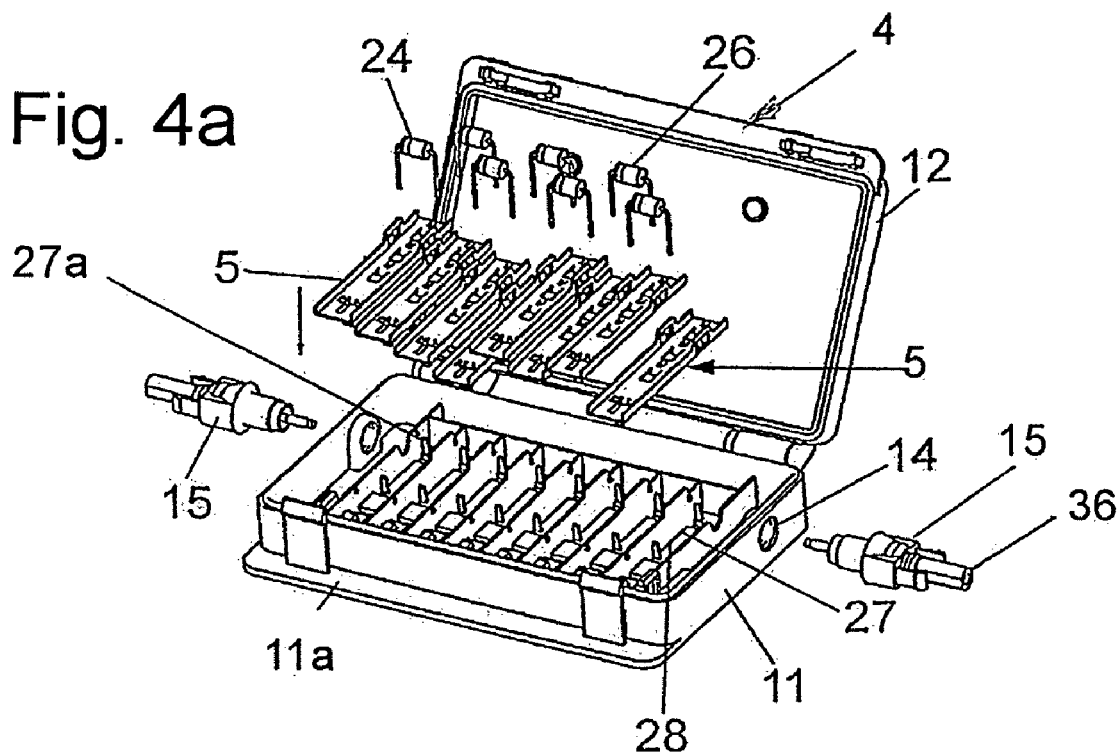
FIGS. 4a-4d are perspective views illustrating the steps of assembling the connector apparatus of FIG. 2c.
Figure 4B:
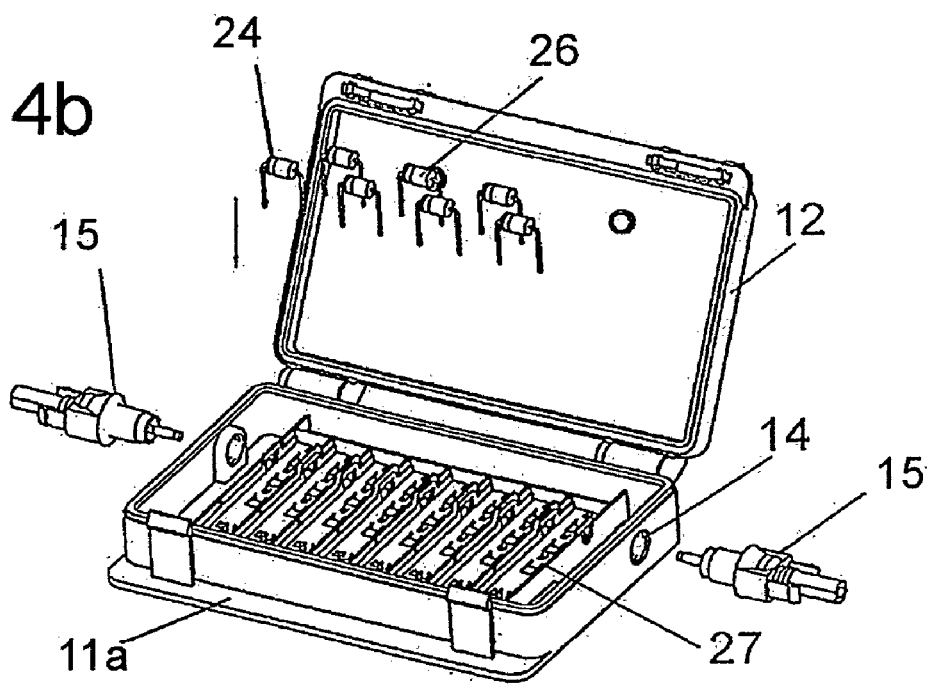
Figure 4C:
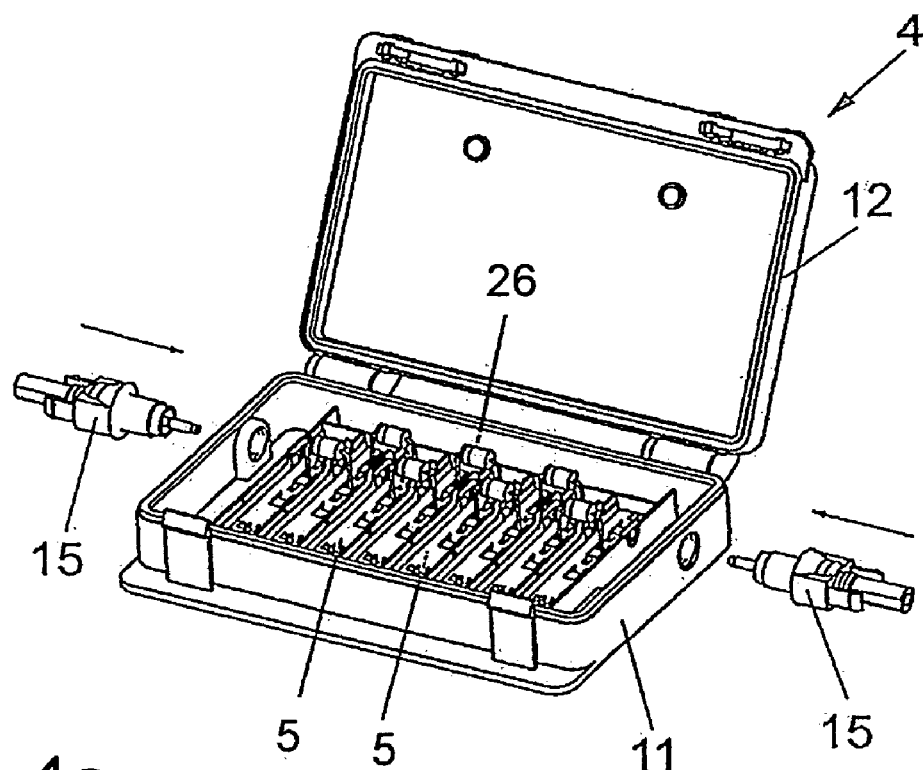
Figure 4D:
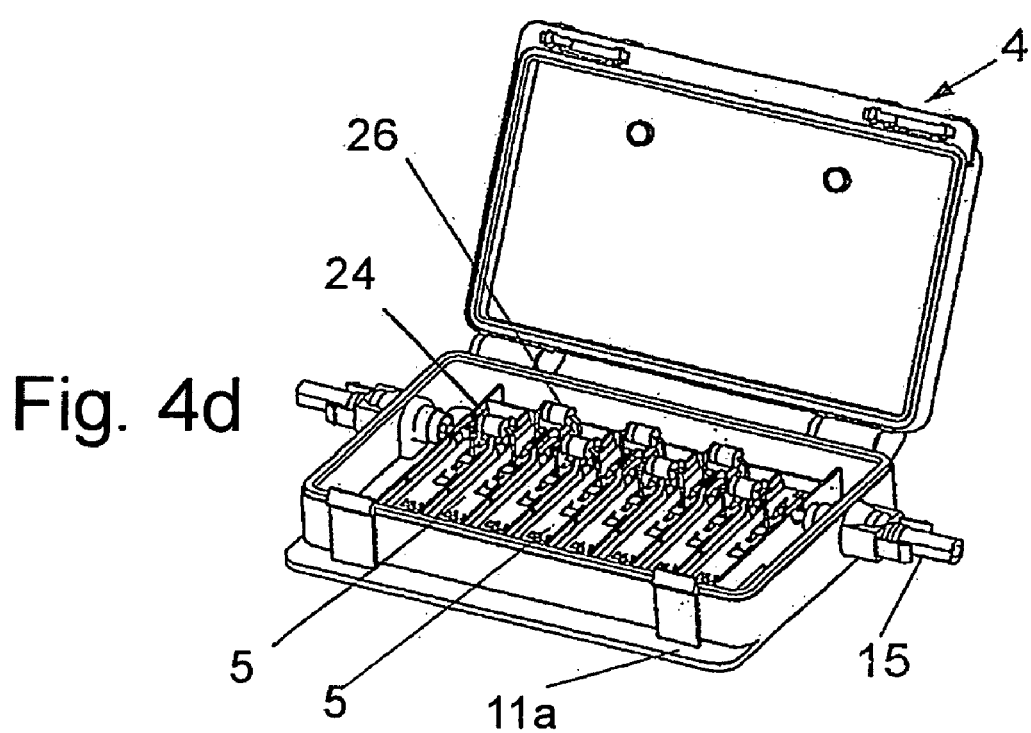
Figure 5:
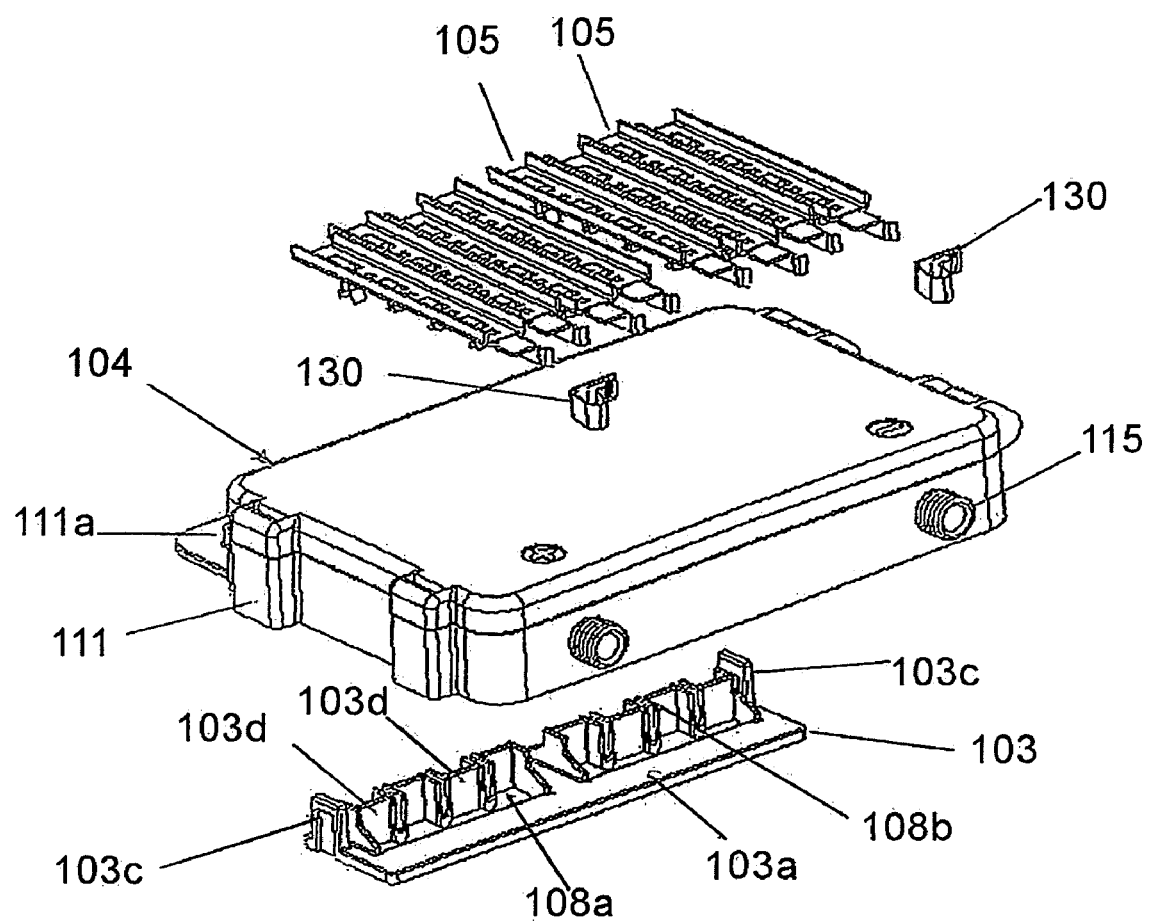
FIG. 5 is an exploded perspective view of a modification of the apparatus of FIG. 2c, and FIGS. 6 and 7 are top and bottom perspective views of the bottom section of the sectional housing of FIG. 5, and FIGS. 8 and 9 are, respectively, top plan and sectional views taken along line 9-9 of FIG. 8.
Figure 6:
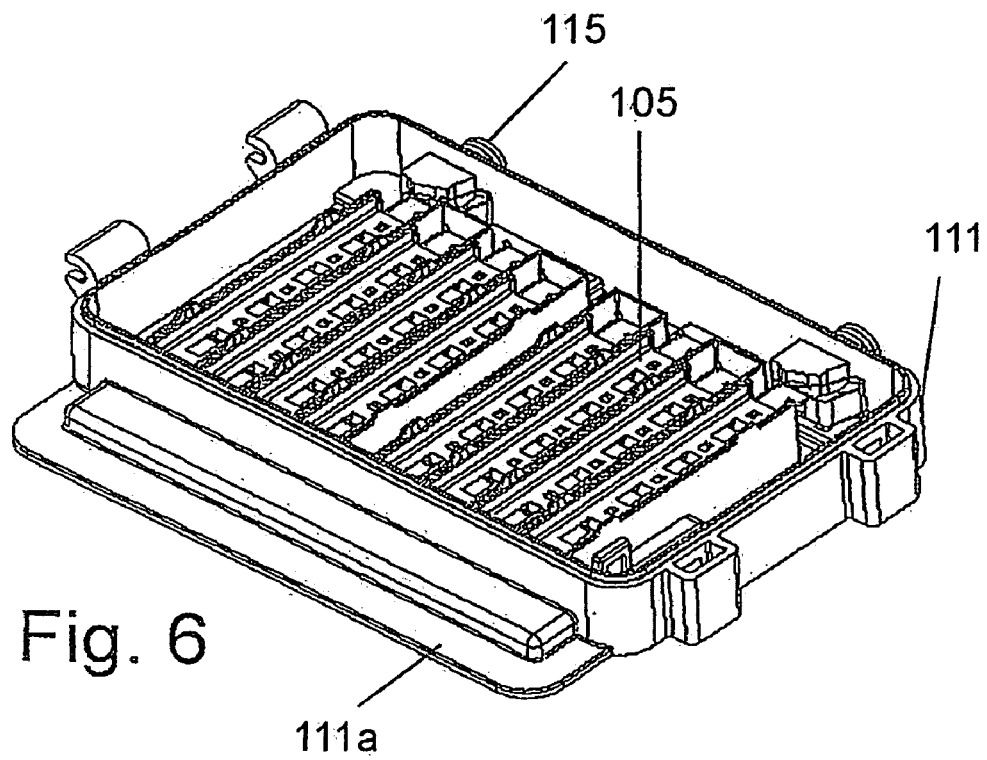

Referring now to FIGS. 2a-2d, the conductor support body 3 is at least partially enclosed by a protective housing 4 having cable connectors 15 attached at each end thereof. As will be explained in greater detail below, the housing 4 contains a chamber in which are mounted a plurality of parallel bus bar means 5 that are arranged for electrical engagement with the bent portions of the flat conductors 2. The bus bars 5 are supported by support members 27 (FIG. 4a) arranged in the chamber of the housing 4, as will be described in greater detail below.

Figure 3A:
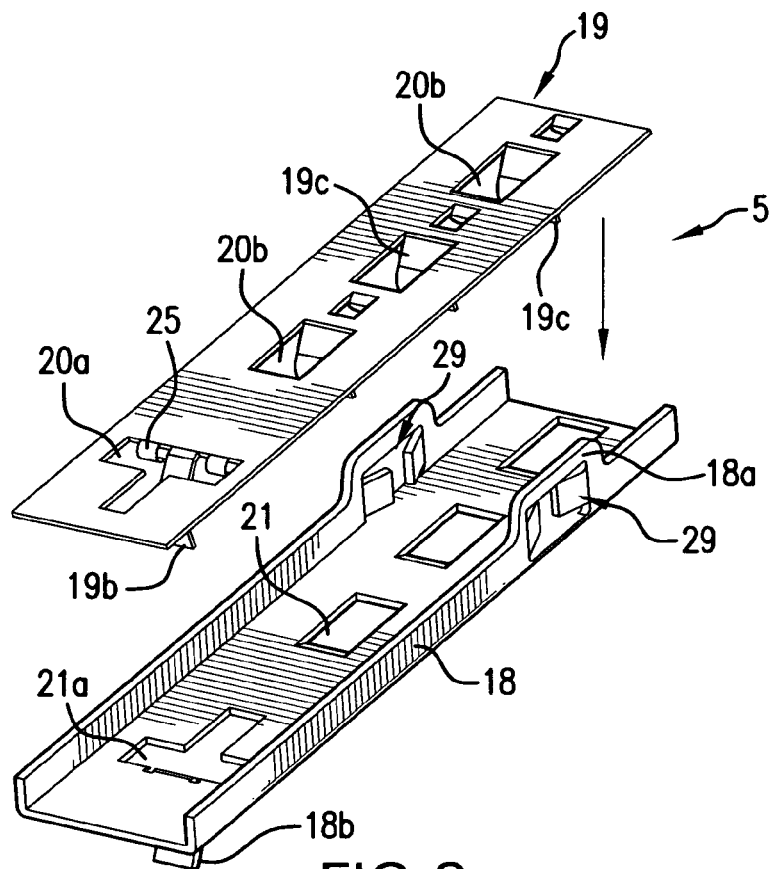
FIGS. 3a and 3b are exploded and top plan views of the bus bar means.
Figure 3B:
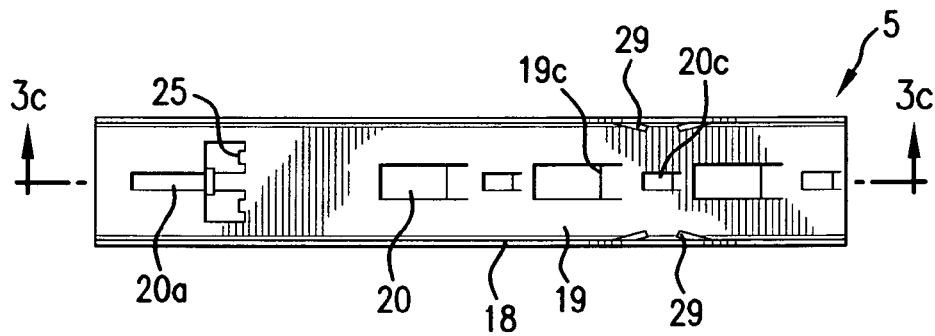
Figure 3C:
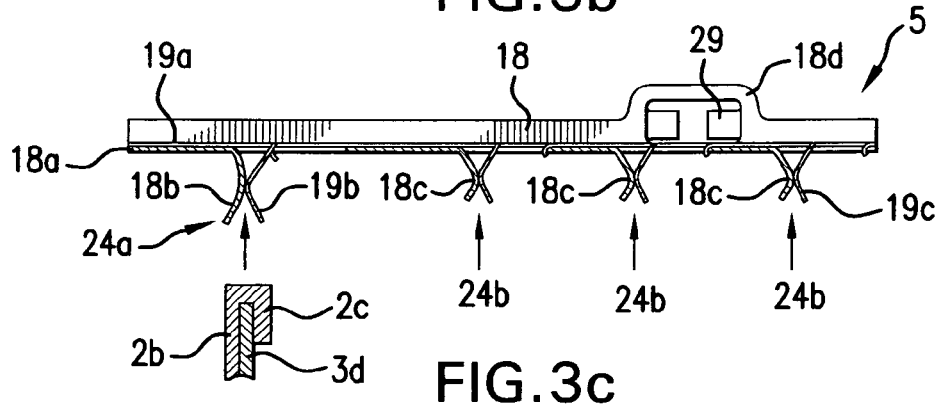
FIG. 3c is a sectional view taken along line 3c-3c of FIG. 3b.

Referring now to FIGS. 3a-3c, each of the bus bar means 5 includes a base plate 18 formed of a bendable conductive metal material, such as a copper alloy, and a cover plate 19 formed from a bendable stronger material, such as spring steel. A plurality of downwardly bent contacts 18b and 18c are punched from the planar portion 18a of the base plate 18, and a plurality of downwardly bent resilient contacts 19b and 19c are punched downwardly from the planar portion 19a of the cover plate 19. The cover plate is arranged with the openings 20a and 20b over the corresponding openings 21a and 21b of the base plate 18, whereupon the cover plate is lowered upon the base plate to the seated position as shown in FIGS. 3b and 3c. As best shown in FIG. 3c, the punched contact 19b from the cover plate and the punched contact 18b from the base plate cooperate to define a first clip-on tulip contact arrangement 24a that engages the intermediate bent end portions 2b and 2c of the conductor at the upper edge of the flat conductor seat 3d. The other downwardly bent contacts 19c from the cover plate cooperate with the downwardly bent contacts 18c of the base plate to define second resilient clip contacts 24b that are adapted for connection with electrical components, such as diodes or the like . Further bent tabs 25 extend downwardly from the cover plate for locking engagement with the corresponding edge of the opening 21a in the base plate 18, thereby to fasten the cover plate to the base plate.

Referring now to FIGS. 4a-4d, the bottom section 11 of the housing 4 is provided with bus bar support members 27 that contain recesses 28, which support members are provided with guide pins 27a that extend into corresponding guide openings 20c contained in the bus bar means. Diodes 24 and 26 are connected across the bus bar second contacts 24b as desired, and cable fittings 15 are inserted into the openings 14 provided in the end walls of the housing base section 11.

Figure 7:
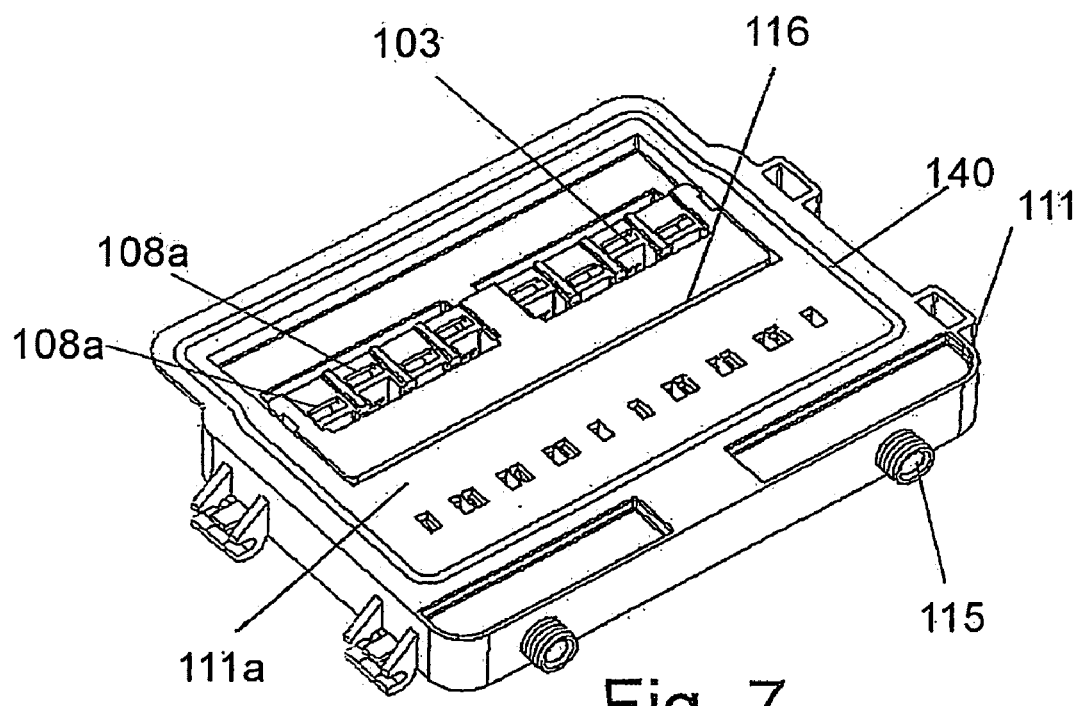
Figure 8:
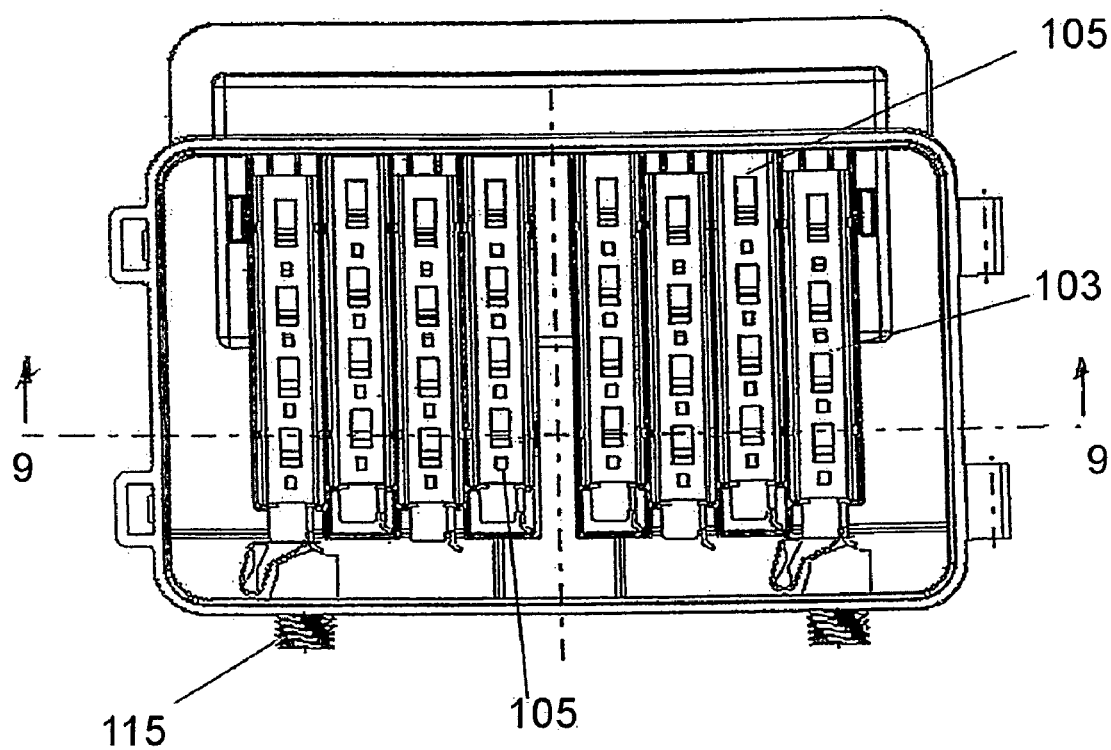
Figure 9:
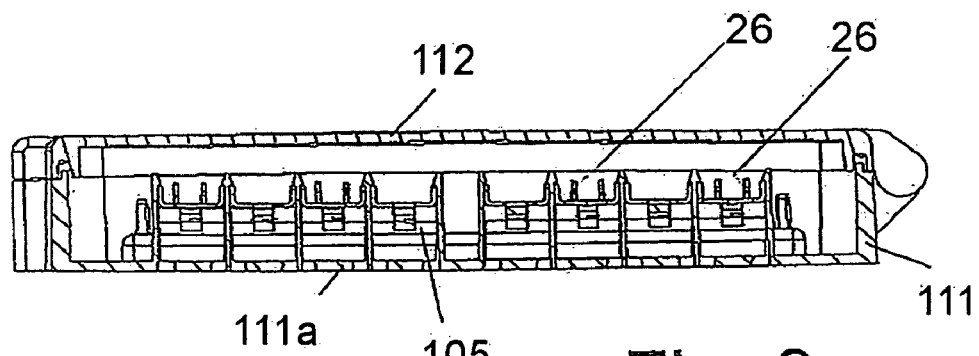

As shown in FIGS. 5-9, the conductor support seats 103d on the bridge portion 103b of the conductor support body 103 may be staggered in an offset manner. As before, the number of bus bar means 105 corresponds with a number of conductor seats 103d provided on the conductor support body 103. L-shaped connectors 130 may be provided for maintaining the conductor support body 103 in place relative to the housing 104. As best shown in FIG. 7, the conductor support body 103 is mounted within an opening 116 contained in the bottom wall 111a of the bottom section 111. A compressible seal member 140 may be provided between the bottom wall 111a of the housing and the adjacent surface of the photovoltaic panel.

Figure 10A:
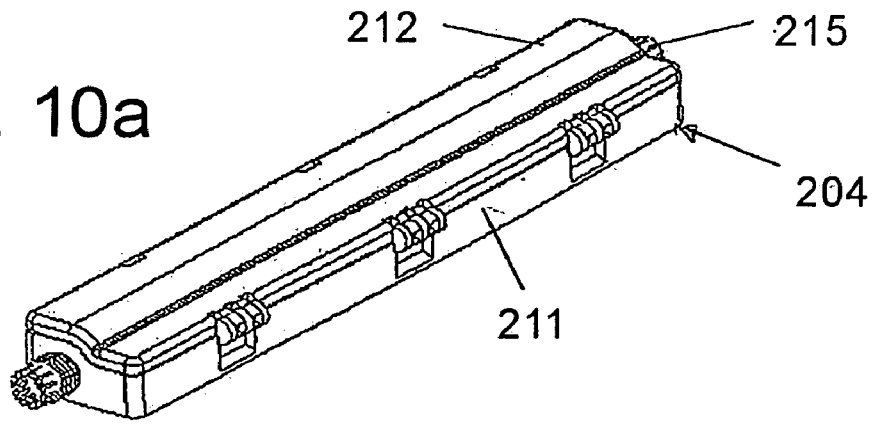
FIGS. 10a is are perspective view of a narrow embodiment of the invention.
Figure 10B:
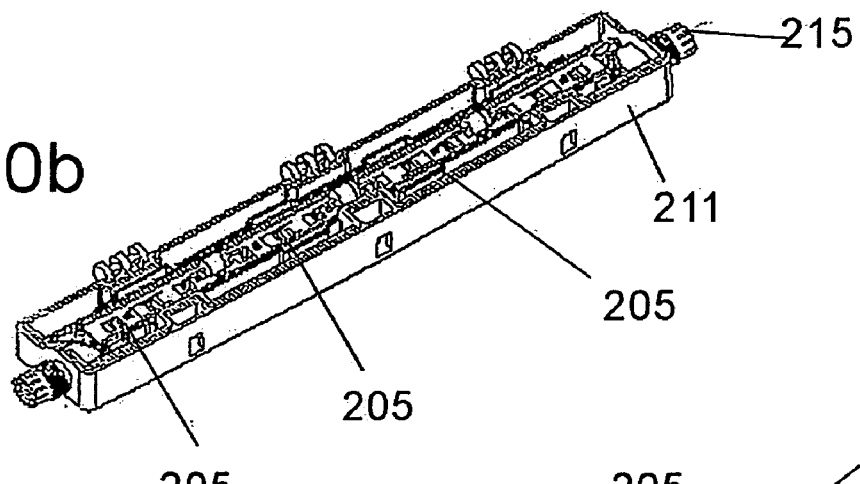
FIGS. 10b and 10c are top and bottom perspective views of the connector module of FIG. 10c.
Figure 10C:
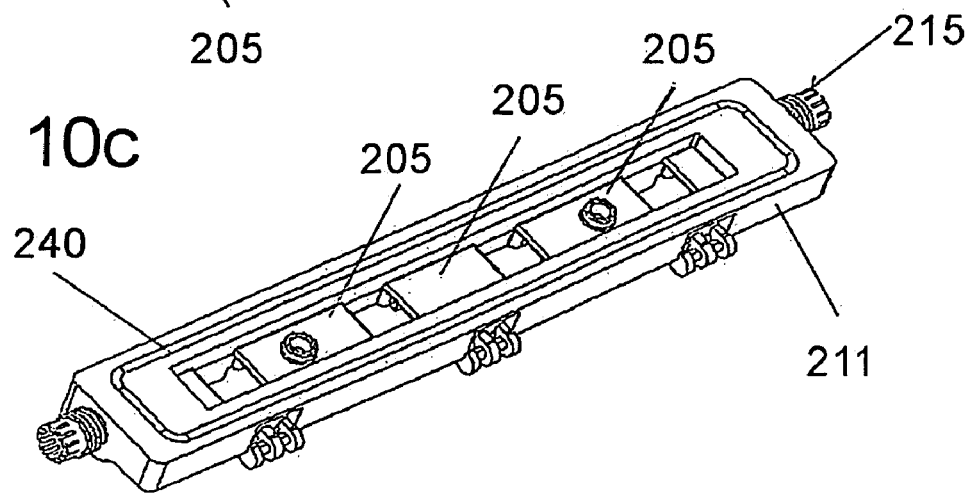
Figure 11:
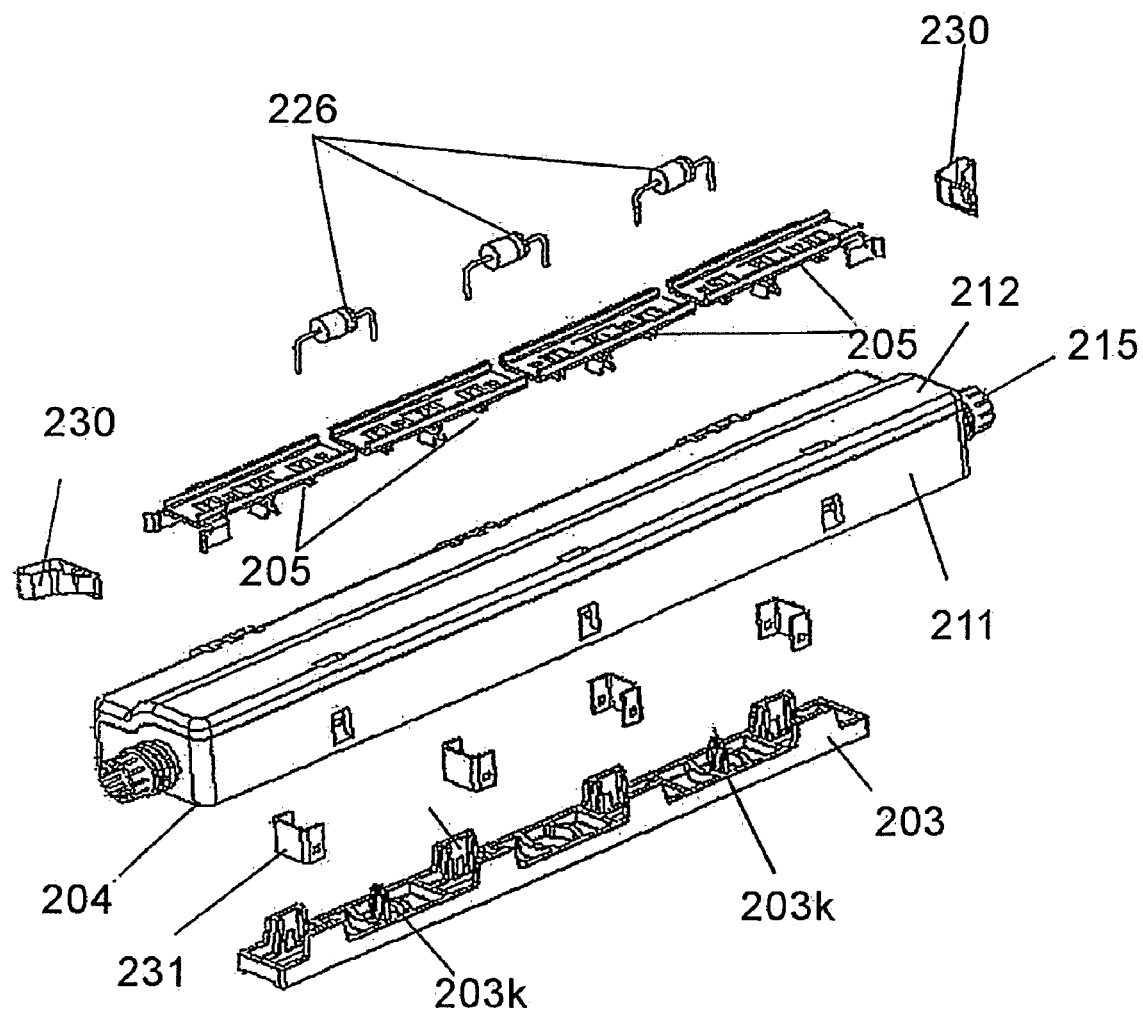
FIG. 11 is an exploded view of the connector apparatus of FIGS. 10-10c.
Figure 12A:
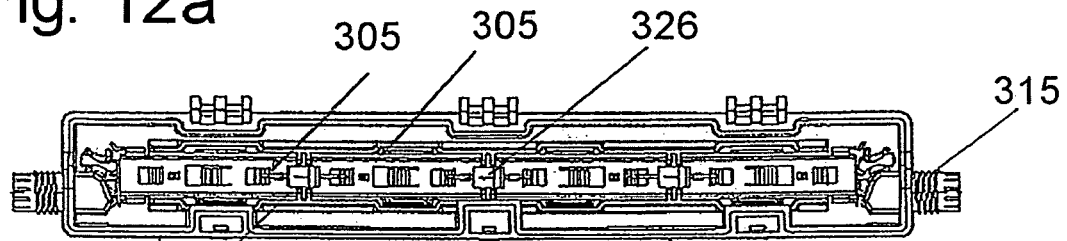
FIGS. 12a, 12b and 12c are top, detailed top, and bottom views, respectively, of the bottom member of FIG. 10b.
Figure 12B:
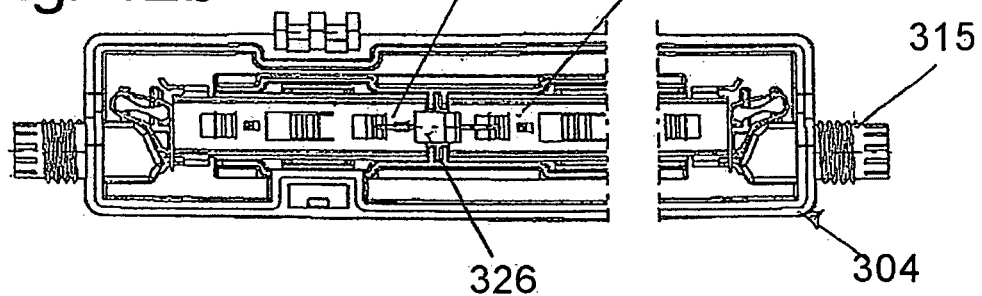
Figure 12C:
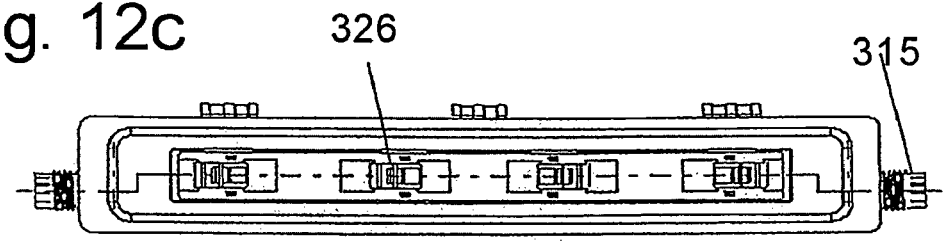
Figure 12D:
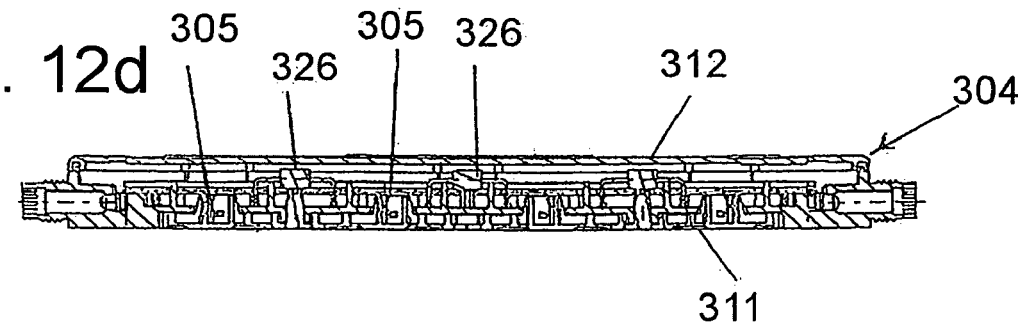
FIG. 12d is a sectional view taken along line 12d-12d of FIG. 12c.
Figure 13A:
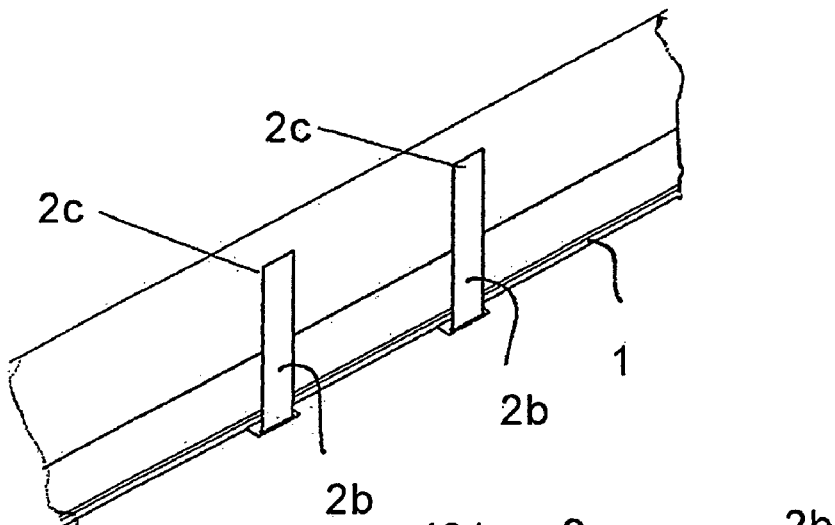
Figure 13B:
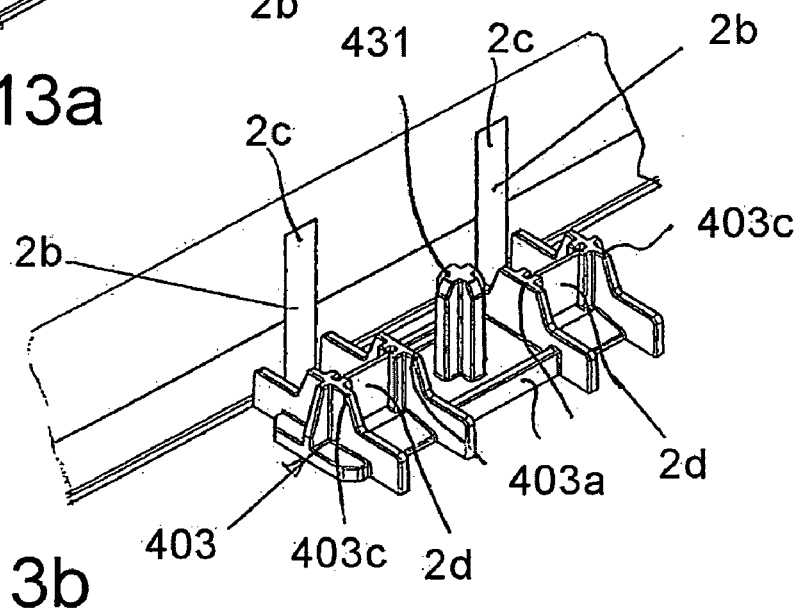
Figure 13C:
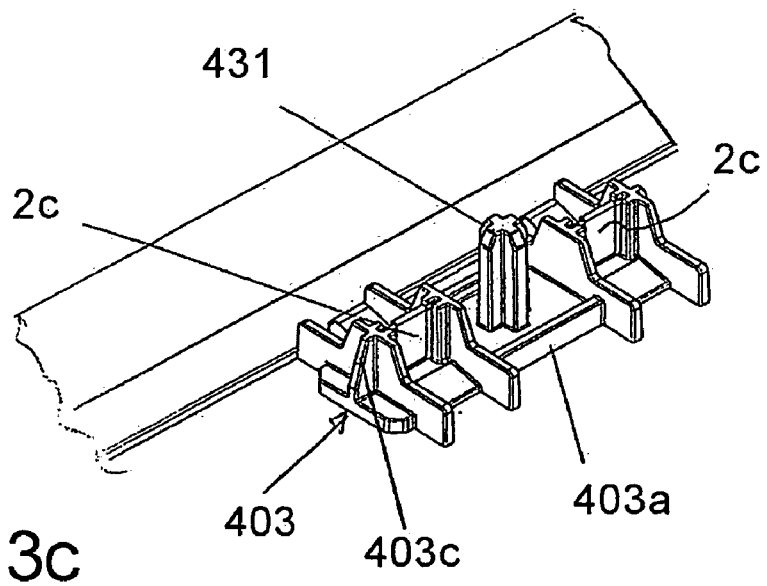
Figure 13F:
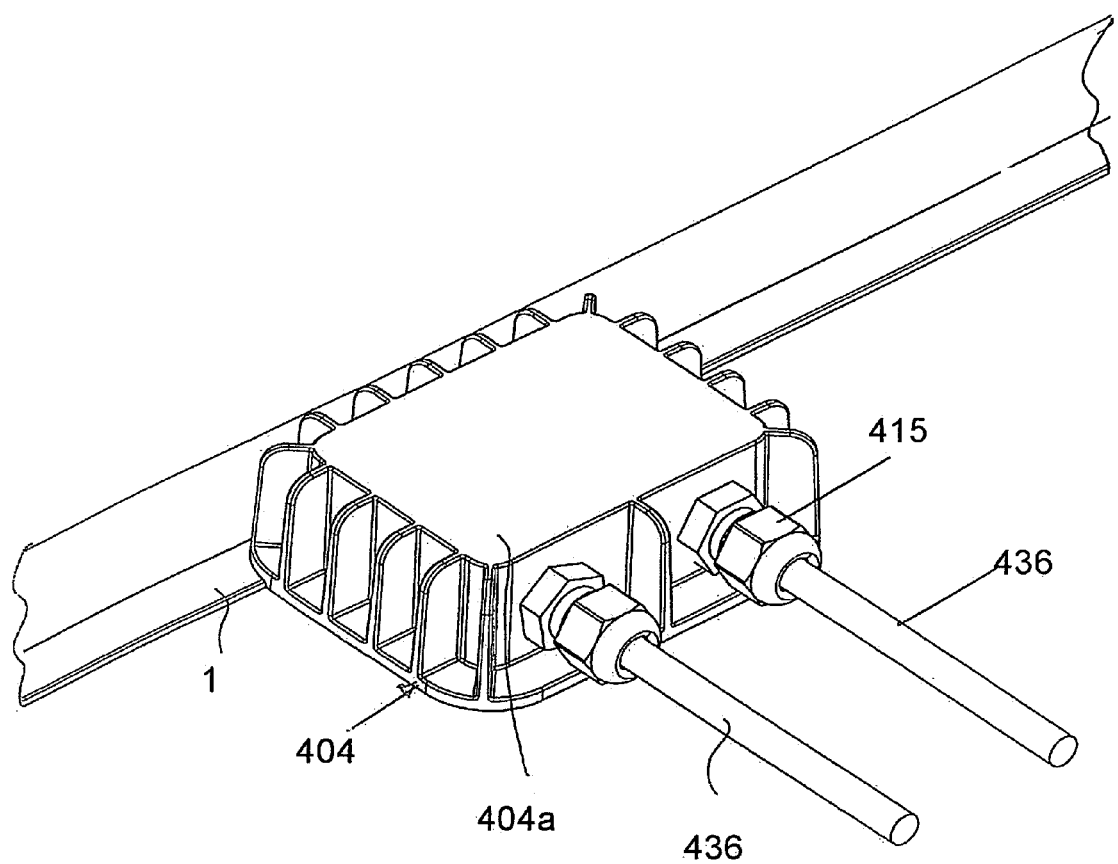

Referring now to the embodiment of FIGS. 10a-10c and 11, the narrow elongated housing 204 includes a lid section 112 that is pivotally connected with the bottom section 211. In this embodiment, the conductor support body 203 is mounted in an opening contained in the bottom of the housing section 211 as best shown in FIG. 10c. The bus bars 205 in this embodiment are arranged longitudinally of the housing 204, as shown in FIG. 11a, and the conductor support body 203 is provided with centering projecting portions 203k that enter into corresponding centering openings contained in the bus bar means 205. The diodes or other electrical components 226 are connected between the various bus bars 205, and connector elements 230 and 231 serve to maintain the bus bars and conductor support body in place within the housing 204. In the modification of FIGS. 12a-12d, the bus bar means 305 are arranged in longitudinally spaced relation within the housing 304. The diodes 326 are connected between the various bus bar means 305.

Figure 14:
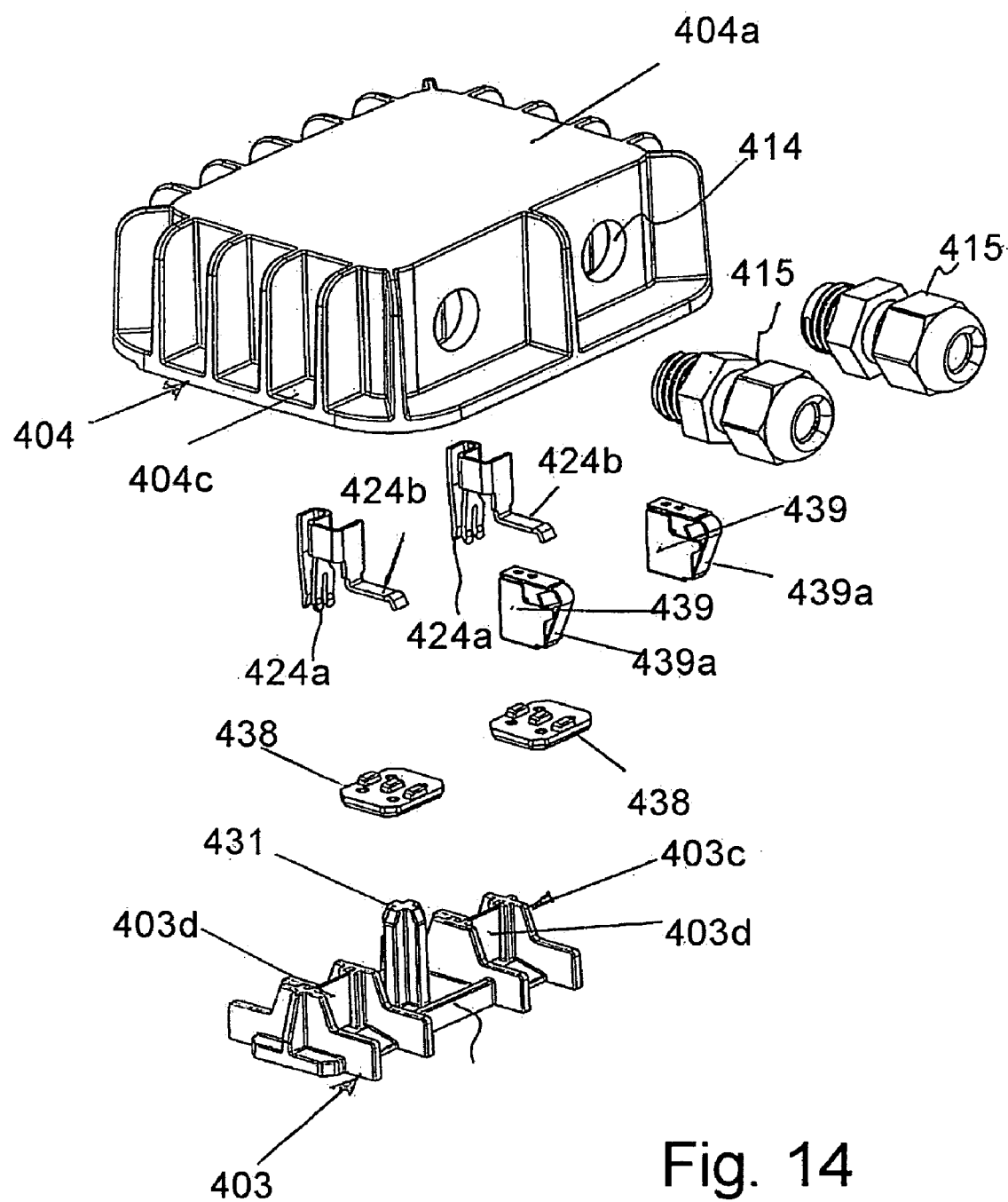
FIG. 14 is an exploded view of the connector apparatus of FIG. 13f.

FIGS. 13a-17 illustrate a further embodiment of the invention, wherein the bridge portion 403b is bifurcated to define an opening in which is provided an upwardly extending centering pedestal 431. When the support body 403 is mounted adjacent the intermediate portions 2b of the conductors, as shown in FIG. 13b, the end portions 2c of the conductors are reversely bent back over the seat portions 403d of the bridge portion of the support member, as shown in FIG. 13c. The housing 404, which includes a top wall 404a, side walls 404b, and an open bottom provided with a bottom flange 404c, is seated downwardly upon the conductor support body 403. Referring to FIG. 13e, it will be seen that the housing 404 includes a centering opening 432 that receives the centering projection 431 on the support body 403, thereby to locate the position of the housing 404 relative to the conductor support body 403. The bus bar clip-on contacts 402a therefore are aligned with the bent over conductors supported by the seat portions of the conductor support member 403, thereby to connect the bus bars 405 associated with the contacts 424a with the conductors 2, respectively. The bus bars 405 connect the conductors 2 with the cables 436 by electrical components such as the printed circuit components 438 and the cable connectors 415, as shown in FIG. 13e. The assembled components are show in FIG. 13f, and the exploded components are shown in FIG. 14. More particularly, the clip-on contacts 424a have arm extensions that contact the printed circuit boards 438 via connector members 439, respectively.

Referring to FIGS. 15 and 16, the bottom flange portion 404c of the housing 404 is fastened to the photovoltaic panel 1 by means of a two-sided adhesive strip 442, and the conductor support body 403 is fastened to the photovoltaic panel 1 by a two-sided adhesive strip 440. The engagement of the clip-on contacts 424a with the conductor seat 403d of the support body 403 is shown in these figures.

Figure 18:
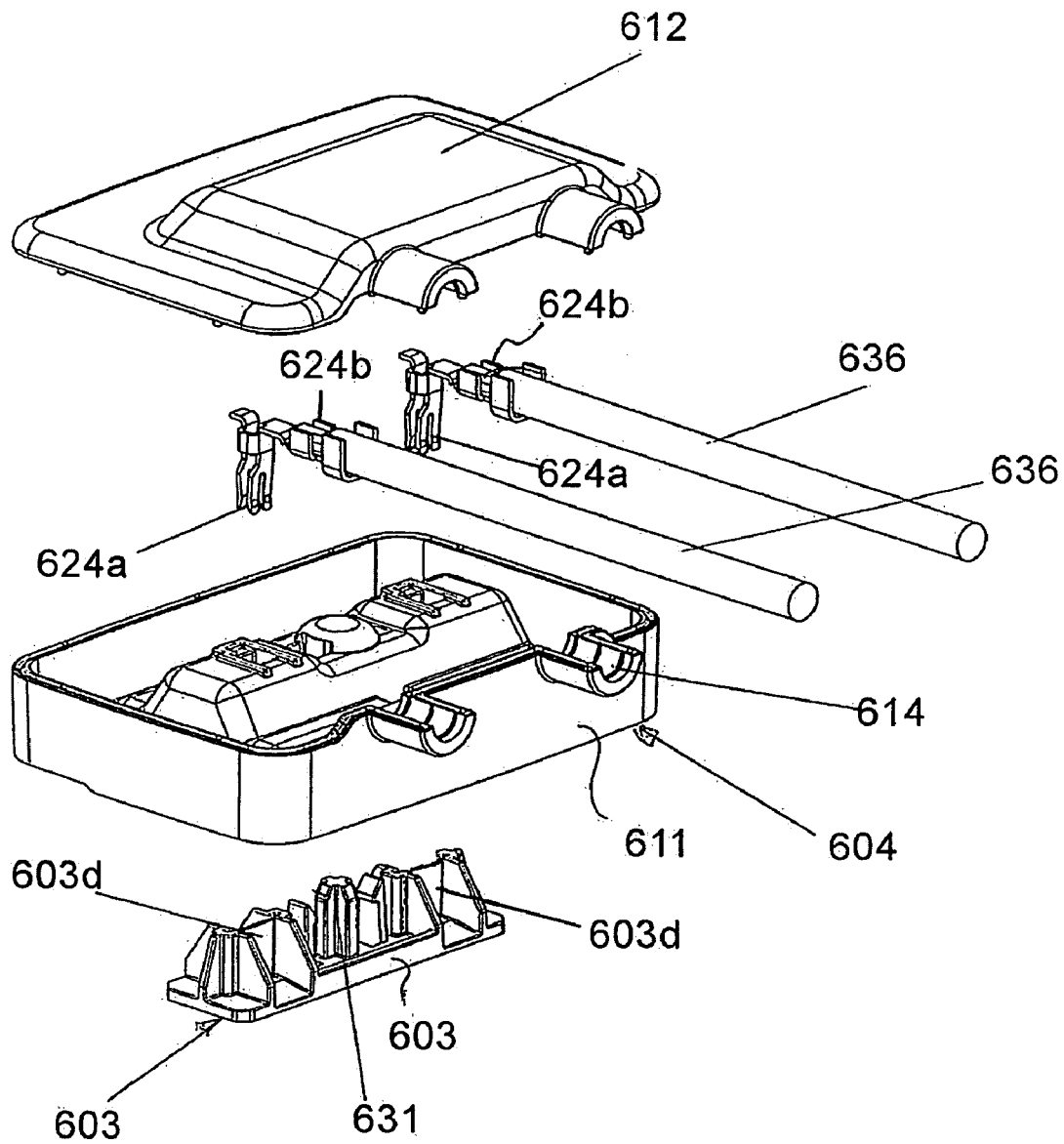
FIGS. 18 and 19 are exploded perspective views of other embodiments of the present invention.

In the modification of FIG. 17, a support member 548 is provided having a collar 548a that extends protectively around the clip-on contacts 524a that engage the conductor seat 503d of the conductor support member 503. In this embodiment, the housing 504 is fastened to the photovoltaic panel I by the screw means 552, and the conductor support body 503 is fastened to the panel by the two-sided adhesive strip 540. In the modification of FIG. 18, the resilient clip-on contacts 424a that are connected with the conductors reversely bent back upon the support seats 603d are directly connected to the output cables 636 that extend through the openings 614 in the housing 604.

Figure 19:
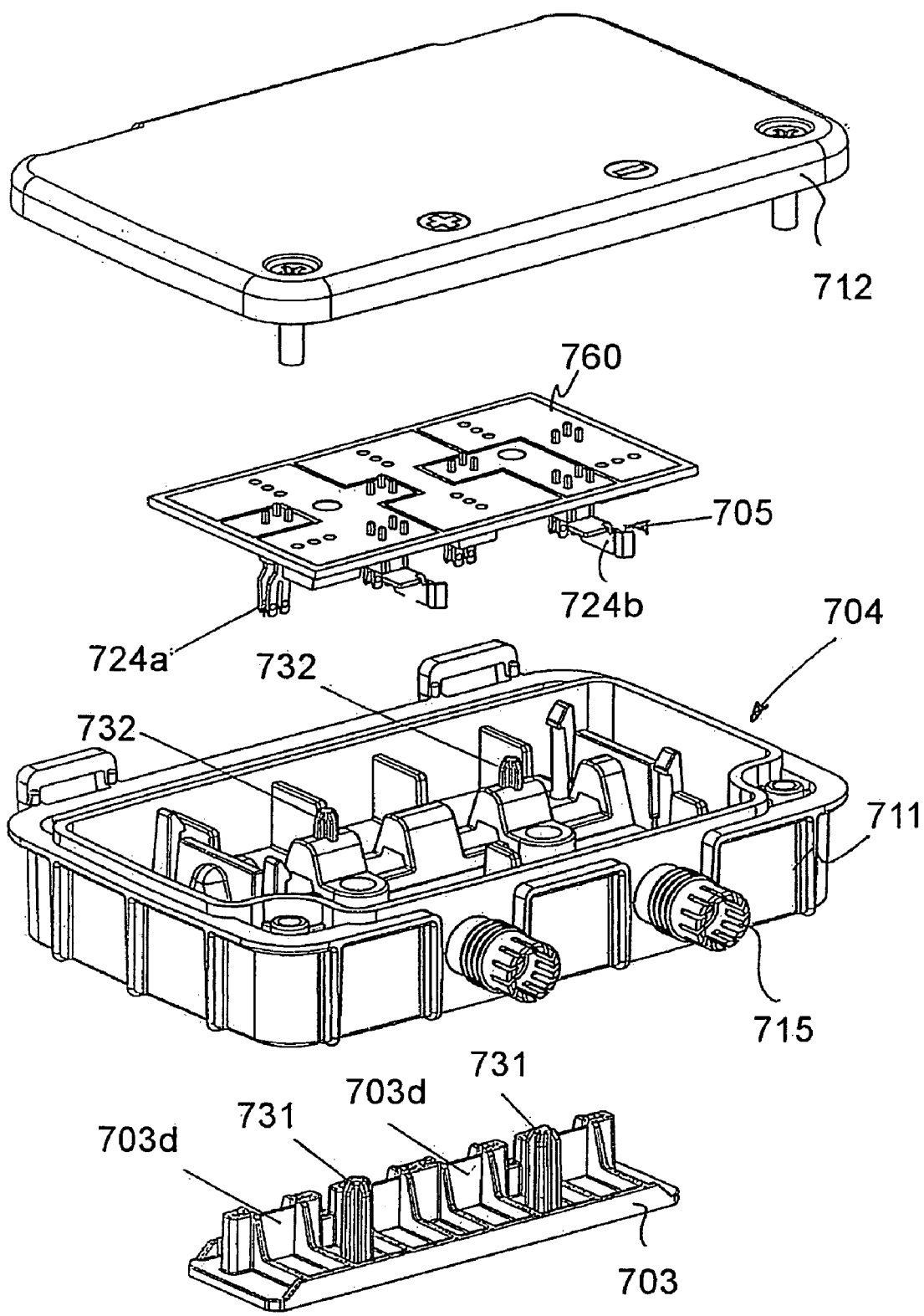
Figure 20:
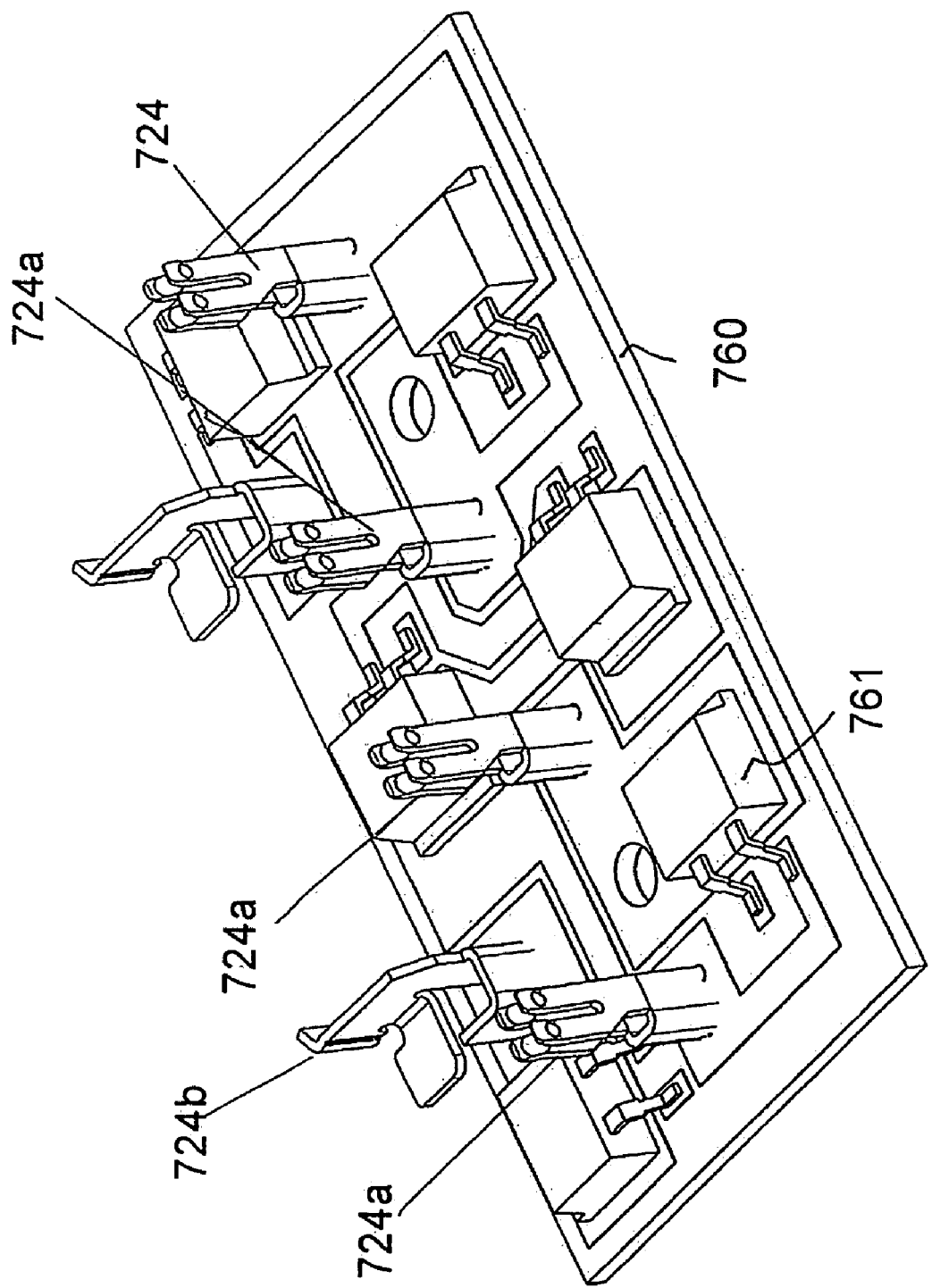
FIG. 20 is a bottom perspective view of the printed circuit board of FIG. 19.

In the embodiment of FIG. 19, a pair of alignment pedestals 731 on the conductor support body 703 align the body relative to the bottom section 711 of the housing 704. Furthermore, alignment pedestals 732 facilitate the mounting of a printed circuit board 760 within the chamber contained within the housing 704. FIG. 20 illustrates the bottom of the printed circuit board, wherein the four clip-on contacts 724a are arranged for engagement with the conductors that are bent around the corresponding four conductor seats 703d on the conductor support body 703, respectively.

While in accordance with the provisions of the Patent Statutes the preferred forms and embodiments of the invention have been illustrated and described, it will be apparent to those skilled in the art that changes may be made without deviating from the invention described above.

What is claimed is:

1. Connector apparatus for connecting a plurality of parallel spaced flat coplanar flat conductors (2) of a photovoltaic panel (1) to an electrical component, comprising:
    (a) a generally rectangular conductor support body (3) formed of electrical insulating material, said support body having a longitudinal axis and including:
        (1) a generally planar base portion (3a) adapted for connection with the photovoltaic panel; and
        (2) a bridge portion (3b) orthogonally arranged relative to said base portion, said bridge portion having a plurality of longitudinally spaced conductor support seats (3d) for supporting intermediate portions (2b) of the conductors that are bent to positions normal to the panel, said seats having edges remote from said base portion around which the free end portions (2c) of the conductors are reversely bent;
    (b) a plurality of bus bar means (5) associated with said conductor seats, respectively, each of said bus bar means including first contact means (24a) arranged for engagement with that portion of a conductor that is bent over the edge of the associated conductor seat, respectively, and at least one output contact means (24b) adapted for connection with the electrical component; and
    (c) protective housing means (4) at least partially enclosing said conductor support member bridge portion and said bus bar means.

2. Connector apparatus as defined in claim 1, wherein the surfaces of said conductor support seats (3d) are planar and generally normal to the plane of the photovoltaic panel.

3. Connector apparatus as defined in claim 2, wherein said support seats are coplanar and parallel with the conductor support body longitudinal axis.

4. Connector apparatus as defined in claim 2, wherein said support seats are parallel with and staggered relative to said conductor support body longitudinal axis.

5. Connector apparatus as defined in claim 2, wherein said conductor support body base portion includes a pair of integral parallel spaced pedestal portions (3c) that extend orthogonally from conductor support base portion, said bridge portion being connected between said pedestal portions.

6. Connector apparatus as defined in claim 2, wherein said conductor body contains at least one through opening (8) through which extends the intermediate portion of at least one of the flat conductors.

7. Connector apparatus as defined in claim 1, wherein said bus bar means first contact means comprises resilient clip contact means (24a).

8. Connector apparatus as defined in claim 7, wherein said bus bar means comprises a conductive base plate (18), and a cover plate (19) formed of resilient metal material, said base and cover plates having planar portions (18a, 19a) mounted in contiguous parallel relation, said first contact means comprising a pair of cooperating tongue contacts (18b, 19b) punched out from said base and cover plates, respectively.

9. Connector apparatus as defined in claim 8, wherein said output contact means comprises second resilient clip contact means (24b) including a pair of cooperating tongue contacts (18c, 19c) punched from said bus bar base and cover plates, respectively.

10. Connector apparatus as defined in claim 9, and further including retaining means (25) for fastening together said bus bar base and cover plates.

11. Connector apparatus as defined in claim 1, wherein said protective housing means comprises a hollow housing containing a chamber having top and side walls, at least said support member bridge portion and said bus bar means being contained within said housing chamber.

12. Connector apparatus as defined in claim 11, and further including means (440; 540) for fastening said support body base portion to the photovoltaic panel.

13. Connector apparatus as defined in claim 12, wherein said housing contains a bottom wall; and further wherein said conductor support body extends within a housing chamber via an opening (16) contained in said housing bottom wall.

14. Connector apparatus as defined in claim 13, and further including fastening means (442; 552) for fastening said housing to the photovoltaic cable.

15. Connector apparatus as defined in claim 11, wherein said housing is sectional and comprises a bottom portion (11) including said bottom and side walls, and a lid portion (12) including said top wall, said lid portion being pivotally connected with said bottom portion for pivotal displacement between open and closed positions relative to said bottom portion.

16. Connector apparatus as defined in claim 15, wherein said conductor support body is mounted in said housing chamber on said bottom wall, said housing bottom wall containing openings for receiving the photovoltaic panel flat conductor intermediate portions.

17. Connector apparatus as defined in claim 15, and further including a plurality of bus bar mounting means (27) arranged in said housing chamber for supporting said bus bar means, respectively.

18. Connector apparatus as defined in claim 17, wherein said bus bar mounting means include centering projections (27a) on said mounting means for positioning said bus bars relative to said housing.

19. Connector apparatus as defined in claim 11, wherein at least one of said side and end walls contains an opening (14) for receiving one end of a cable, and means electrically connecting said cable end to said bus bar means.

20. Connector apparatus as defined in claim 11, wherein said conductor support body includes at least one centering projection (431; 631; 731) for positioning said support body relative to said housing.

\* \* \* \* \*